United States Patent [19]

Hellgren

[11] Patent Number: 4,509,808
[45] Date of Patent: Apr. 9, 1985

[54] HIGH VOLTAGE, GAS TIGHT CONNECTOR
[75] Inventor: Leroy L. Hellgren, Los Gatos, Calif.
[73] Assignee: The United States of America as represented by the Secretary of the Navy, Washington, D.C.
[21] Appl. No.: 476,749
[22] Filed: Mar. 18, 1983
[51] Int. Cl.³ .............................................. H05K 1/00
[52] U.S. Cl. .............................. 339/17 R; 339/17 C; 339/268 S
[58] Field of Search ............ 339/272, 263, 268, 17 R, 339/17 C, 17 LC

[56] References Cited

U.S. PATENT DOCUMENTS

| 368,149 | 8/1887 | Higgins. | |
|---|---|---|---|
| 1,329,448 | 2/1920 | Von Post | 339/268 S |
| 1,527,400 | 2/1925 | Frankel | 339/268 S |
| 1,962,326 | 6/1934 | Randall | 173/363 |
| 2,440,828 | 5/1948 | Nichols | 339/268 S |
| 2,463,144 | 3/1949 | Buchanan | 287/83 |
| 2,784,386 | 3/1957 | MacFadden | 339/128 |
| 3,631,373 | 12/1971 | Matrisian | 339/17 C |

FOREIGN PATENT DOCUMENTS 581554 1/1924 France .............. 339/268 S

Primary Examiner—Neil Abrams
Assistant Examiner—David L. Pirlot
Attorney, Agent, or Firm—R. f. Beers; C. D. B. Curry; G. L. Craig

[57] ABSTRACT

A socket wire connector for effecting a high-voltage, gas-tight joint between an electrical wire and the connector. The socket side of the connector has a hemispherical portion soldered to one side of an electrical breadboard with a tapered, slotted cylindrical piece extending through the breadboard. An electrical wire may be inserted in the socket portion and the cap nut portion of the connector screwed onto the cylindrical piece to form a high-voltage gas-tight joint.

2 Claims, 9 Drawing Figures

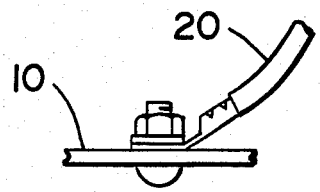
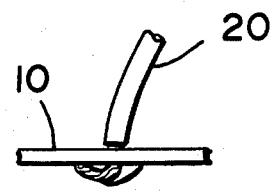
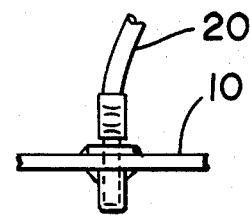
FIG_1A (PRIOR ART)   FIG_1B (PRIOR ART)   FIG_1C (PRIOR ART)
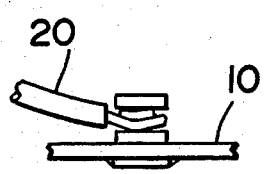
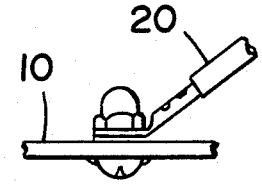
FIG_1D (PRIOR ART)   FIG_1E (PRIOR ART)   FIG_1F (PRIOR ART)
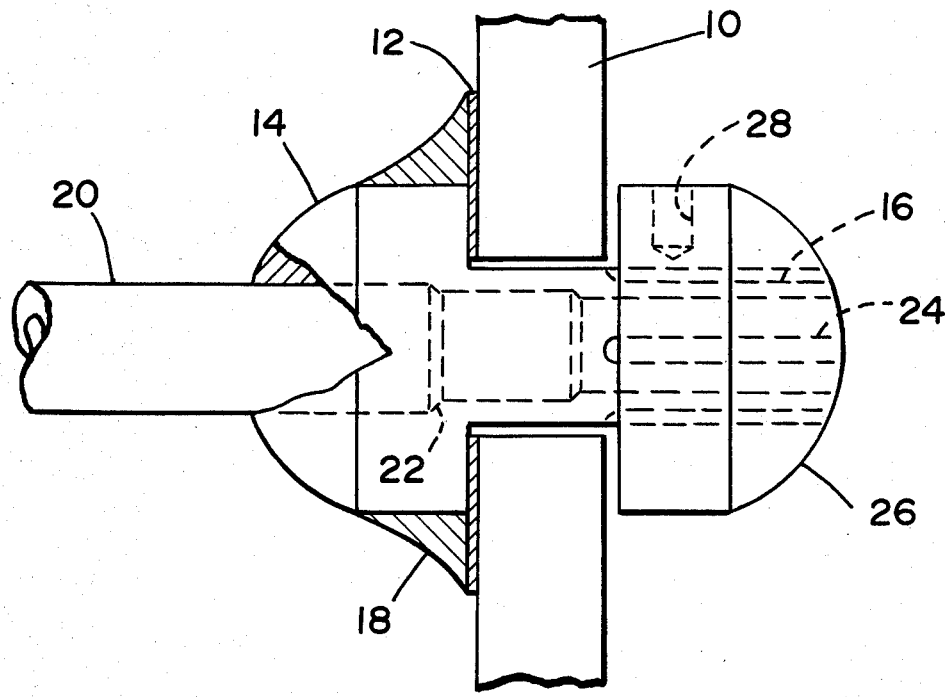
FIG_2

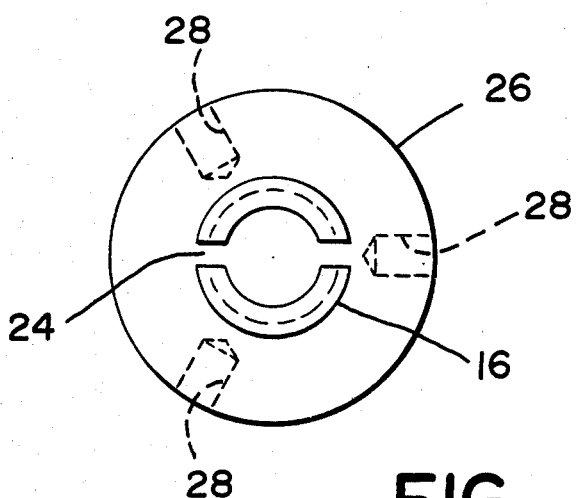
FIG_3
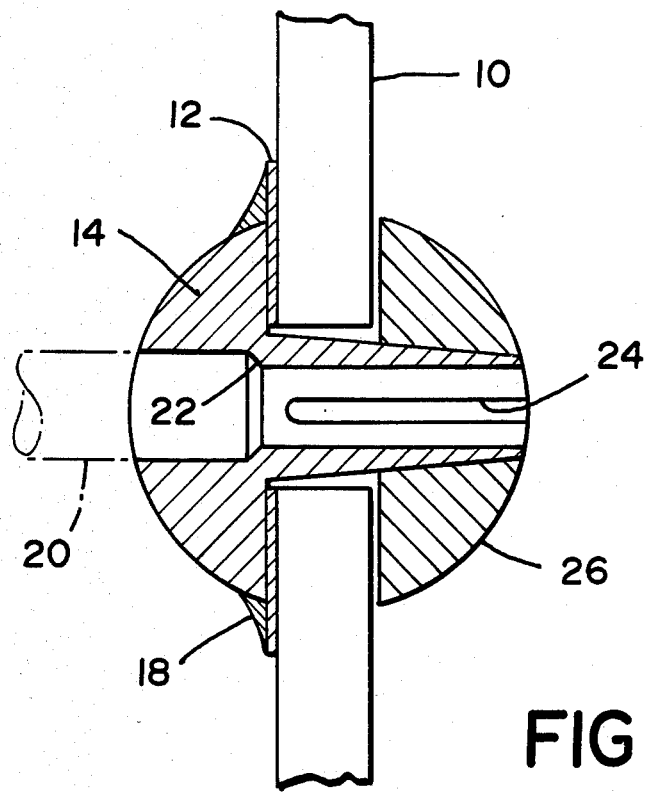
FIG_4

HIGH VOLTAGE, GAS TIGHT CONNECTOR

BACKGROUND OF THE INVENTION

1. Field of the Invention

The invention relates to high voltage connectors for mounting on electrical circuit boards. In particular, the invention relates to a high-voltage connector in which one portion of the connector is soldered to the circuit board and can receive an electrical wire and a cap nut is then attached to the soldered portion to form a high-voltage, gas-tight electrical contact with the enclosed wire.

2. Description of Prior Art

In high-voltage circuits, e.g., 750 volts or greater, there is always the problem of arcing or corona emanating from sharp corners or projections of the circuit connectors. Once arcing or corona begins at points of high voltage stress, loss of discharge voltage and degradation of both the circuit and surrounding insulation proceeds rapidly. Even where design precautions are taken against circuit connectors having sharp projections, arcing and corona are inherent in point contact connectors where gaps may exist between contacts or where a gas path may surround the contact. The present invention avoids these problems found in the prior art by providing a gas-tight, line-contact electrical connector having no sharp corners or edges from which arcing or corona may emanate. The connector has a further advantage in that the electrical wire held within the connector may be easily removed without removing the connector from the circuit board.

SUMMARY OF THE INVENTION

A socket wire connector for effecting a high-voltage, gas-tight joint between an electrical wire and the connector. The socket side of the connector has a hemispherical portion for solder connection to one side of an electrical breadboard with a tapered, slotted cylindrical piece extending through the breadboard. An electrical wire may be inserted into the socket portion and the cap nut portion of the connector screwed onto the cylindrical piece to form a gas-tight, high-voltage joint.

A primary object of invention is to provide a two-piece connector which releasably holds an electrical wire such that a joint is formed which is gas-tight and from which no arcing or corona occurs under high voltage.

Other objects and features of invention will become apparent when taken in conjunction with the following description and associated drawings.

BRIEF DESCRIPTION OF THE DRAWINGS

FIGS. 1A-1F illustrate examples of prior art electrical connectors.

FIG. 2 is a cross-section view of the present invention.

FIG. 3 is a plan view of the cap-nut of the present invention.

FIG. 4 is a cross-section view of an alternate embodiment of the present invention.

DESCRIPTION OF THE PREFERRED EMBODIMENT

Referring to FIGS. 1A-1F, typical examples of prior art electrical connectors are shown connecting an electrical wire 20 to an electrical circuit board 10. All have at least one sharp edged surface from which corona or arcing can occur and none provide a gas-tight seal.

The preferred embodiment of the instant invention is shown in FIG. 2. A conventional printed circuit board 10 or multilayer board laminate having a copper circuit on one side has portions of the circuit terminate in circular pads 12 for electrical connections to other circuits. The socket side 14 of the present invention is shaped like a hemisphere having a threaded cylindrical extension 16 protruding through the circuit board 10. The socket 14 and cylindrical extension 16 have a central bore such that when the socket 14 is joined to the copper pad 12 by a solder joint 18, a solid wire 20 which has had its insulation trimmed back to step 22 may be inserted into the bore to a depth such that it is approximately flush to the end of the threaded cylindrical extension 16. A slot 24 is provided in the cylindrical extension 16 such that a spherical cap nut 26 may then be threaded on the extension and torqued down causing the extension to compress about the wire and form a gas-tight seal. Referring to FIGS. 2 and 3, the cap nut 26 is torqued down using a spanner wrench, not shown, having a projection on its inner arcuate surface that fits into any of three holes 28 spaced at 120° intervals in the circumference of the cap nut.

The preferred embodiment may also be practiced by omitting the threads on the cylindrical extension 16 and the threads and holes 28 in the cap nut 26. The cap nut 26 in this case should be formed from the trademarked material NITINOL such that it contracts under heat about the cylindrical extension 16 to form a gas-tight line contact joint as required.

An alternative embodiment of the present invention is shown in FIG. 4. Here the extension of the socket 14 through the electrical circuit board 10 has a taper rather than a threaded outer surface. The cap nut 26 also has a tapered central bore rather than holes in its circumference such that the cap is pressed on the tapered extension with a predetermined amount of pressure to form the gas-tight seal.

What is claimed is:

1. A high voltage electrical connector for high-voltage gas-tight coupling to an electrical circuit on a circuit board comprising:
   (a) a socket portion having a smooth hemispherical upper surface and a flat lower surface for contact with the electrical circuit on the circuit board, said socket further having a central cylindrical extension from said flat surface sufficient to extend through and slightly beyond said circuit board, said socket and said cylindrical extension having a continuous central bore for receiving electrical wire, said cylindrical extension having a segment of said extension protruding beyond said circuit board threaded on its outer circumference;
   (b) at least one slot in said cylindrical extension, said slot extending the length of said extension protruding beyond said circuit board; and
   (c) a cap nut having an upper hemispherical surface and a lower flat surface and having a threaded central cylindrical bore for receiving said cylindrical extension, said cap nut having at least one hole in its circumference for engaging a tightening device whereby said cap nut is screwed down on said cylindrical extension with said flat surface facing said circuit board causing said extension to compress about said wire until said cylindrical extension forms a gas-tight electrical line contact with said wire.

2. A high-voltage electrical connector for high-voltage gas-tight coupling to an electrical circuit on a circuit board comprising:
(a) a socket portion having a smooth hemispherical upper surface and a flat lower surface for contact with the electrical circuit on the circuit board, said socket further having a central tapering extension from said flat surface sufficient to extend through and slightly beyond said circuit board, said socket and said tapering extension having a continuous central bore for receiving electrical wire;
(b) at least one slot in said tapering extension, said slot extending the length of said extension protruding beyond said circuit board; and
(c) a cap nut having an upper hemispherical surface and a lower flat surface and having a tapering central bore for compressably receiving said tapering extension whereby said cap nut is pressed upon said tapering extension with said flat surface facing said circuit board with predetermined force compressing said tapering extension to form a gas-tight electrical line-contact with said wire.

* * * * *